(12) United States Patent
Lee

(10) Patent No.: US 6,462,627 B1
(45) Date of Patent: Oct. 8, 2002

(54) OSCILLATOR CIRCUIT HAVING REDUCED PHASE NOISE

(75) Inventor: Jerold Lee, Los Altos, CA (US)

(73) Assignee: Tropian Inc., Cupertino, CA (US)

( * ) Notice: Subject to any disclaimer, the term of this patent is extended or adjusted under 35 U.S.C. 154(b) by 0 days.

(21) Appl. No.: 09/648,914

(22) Filed: Aug. 25, 2000

(51) Int. Cl.⁷ .............................................. H03B 5/12
(52) U.S. Cl. ........................... 331/117 R; 331/117 FE; 331/167; 331/175
(58) Field of Search .................. 331/117 R, 177 V, 331/167, 117 FE, 175

(56) References Cited

U.S. PATENT DOCUMENTS 4,621,241 A * 11/1986 Kiser ..................... 331/117 R

* cited by examiner

Primary Examiner—Arnold Kinkead

(57) ABSTRACT

The present invention, generally speaking, allows for a substantial reduction in oscillator phase noise by modifying the transfer function of a portion of the oscillator, e.g., by adding a zero to the transfer function. Modifying the transfer function reduces the open-loop gain of the oscillator but achieves a desired phase compensation, allowing the oscillator to be operated at the resonance of the resonator instead of off resonance. In an exemplary embodiment, the transfer function is modified by choosing a capacitance value such that, instead of operating as a bypass at the frequency of interest, adds a zero to the transfer function of the oscillator and causes a change in frequency characteristics, achieving an increase in the effective Q of the oscillator. This increase in effective Q translates directly into reduced phase noise. Phase noise improvement in the range of 3dB has been demonstrated.

8 Claims, 6 Drawing Sheets freq, GHz m1
freq=1.679 GHz
Cemit=12.000
phase (S(3,2))=−24.296

OSCILLATOR CIRCUIT HAVING REDUCED PHASE NOISE

BACKGROUND OF THE INVENTION

1. Field of the Invention

The present invention relates to oscillator circuits, particularly high-frequency oscillators.

2. State of the Art

Frequency synthesizers are used to provide high-frequency signals within, for example, various types of communications equipment and measurement instrumentation. As is well known, at microwave frequencies and above, the phase noise generated by reference oscillators included within such synthesizers can significantly degrade the spectral purity of the high-frequency output signal. Phase noise, i.e., frequency jitter, corresponds to the noise power generated by the synthesizer at frequencies other than the desired output frequency. Phase noise in oscillators is a long-standing problem as described, for example, in U.S. Pat. Nos. 6,064,244 and 5,341,110, incorporated herein by reference. Further references include the following, also incorporated herein by reference: Rhea, Randall W., *Oscillator Design and Computer Simulation*, McGraw Hill, 1995; Munt, Roger, "Designing Oscillators for Spectral Purity," *Microwave and RF*, July 1984, p. 133 et seq.; and Abidi, A. A., "How Phase Noise Appears in Oscillators," in *Analog Circuit Design: RF A/D Converters, Sensor and Actuator Interfaces, Low-Noise Oscillators, PLLs, and Synthesizers*, R. J. van de Plassche, J. H. Huijsing, and W. Sansen, Eds., Boston: Kluwer, 1997.

A basic oscillator circuit is shown in FIG. 1. An amplifier 101 has its output signal 103 (which is also the output signal of the oscillator) coupled to a resonator 105. An output signal 107 of the resonator is fed back through a delay circuit 109 to form the input signal 111 of the amplifier. Oscillation is established when two conditions are met: 1. The open-loop gain at node N is unity; and 2. The open-loop phase is $2n\pi$, where n is an integer.

Phase noise in oscillators, which has been well-documented in the forego- ing references and elsewhere, can be expressed as $d\theta/d\omega$.

In one oscillator circuit of known topology, shown in FIG. 2, two NPN transistors are used. A transistor Q1 is an oscillator transistor, and a transistor Q2 is a buffer transistor.

The collector of the oscillator transistor Q1 is coupled to a supply voltage through an inductor L3 (which may be realized in strip-line form). The emitter is coupled to ground through a parallel RC combination (R5, C1). The base is coupled through resistor R9 to a bias network including resistor R3 and resistor R4, coupled to power and to ground, respectively.

The collector of the buffer transistor Q2 is coupled to the supply voltage through an RF choke L1. Also coupled to the collector is a DC blocking capacitor C3, which forms the RF output signal of the oscillator circuit. The emitter of the buffer transistor Q2 is coupled to ground through a parallel RC combination of R6 and C4. The base of the buffer transistor Q2 is coupled through capacitor C2 to the collector of transistor Q1, and is connected to bias resistors R7 and R8.

An oscillator resonator includes a capacitor C5, an inductor L2 (which may be realized as a strip line), a varactor diode D and a capacitor C6, coupled in a "pi" configuration as shown. The inductor and the varactor diode are connected in parallel to ground and occupy the "legs" of the pi configuration. The capacitors occupy the extended "arms" of the pi configuration. A tuning voltage VTUNE is applied to the varactor diode, through a series inductor L3 and shunt capacitor $C_{bp}$. Note that, through the capacitors C5 and C6, the oscillator resonator is capacitively coupled to the collector of the oscillator transistor Q1, on the one hand, and to the base of the oscillator transistor Q1 on the other hand. This capacitive coupling minimizes loading of the resonator.

In the circuit of FIG. 2, oscillations will occur when the open-loop phase delay is $2n\pi$, where n is an integer.

At microwave frequencies, the phase delay through Q1 is non-ideal. Whereas the desired phase delay is 180°, for example, because of parasitics, the phase delay obtained in practice may be in the range of 110 to 135°, for example. Various different phase compensation techniques may be applied to increase the phase shift, including, for example, the use of higher-bandwidth devices such as FETs, use of a delay line, detuning the resonator to align the composite phase correctly, etc. Each of the foregoing alternatives have disadvantages. FETs have poor 1/f noise. Delay lines are bulky. Detuning the resonator for more phase shift lowers the quality factor and consequently degrades phase noise. Hence, none of these alternatives is particularly attractive.

The circuit in FIG. 2 presents a complex impedance and therefore has the potential to affect both RF gain and phase shift, allowing the designer to select a trade-off between gain and phase shift. Commonly, where the technique of detuning the resonator is used for phase compensation, C1 is chosen to function as a bypass at the frequency of interest, with the result that gain is maximized and phase shift is negligible. A plot of phase noise in such a circuit is shown in FIG. 3. At 100kHz, phase noise is shown to be −110.08 dBc/Hz.

The open-loop gain and phase characteristics of the circuit are shown in FIG. 4. Note that the maximum gain (at the "sweet spot" of the resonator) is about 3.5 dB, substantially greater than unity gain required for oscillation. This increased gain is needed because, in operation, the resonator will be detuned (i.e., the resonance moved away from the frequency of interest) for purposes of phase compensation as previously described. With C1 chosen to function as a bypass, the resulting phase characteristic gives what has been regarded as an acceptable effective Q factor for most applications. For signals requiring high spectral purity, such as some 2 G and 3 G cellular radio telephone signals, however, continued noise improvement has been sought.

Other techniques used to lower phase noise include increasing the Q factor of the resonator and operating at higher voltage. Increasing the Q factor of the resonator involves increasing the ratio of L to C. As L is increased, the size of resonator increases. As C is decreased and more closely approaches the range of parasitic capacitances in the circuit, the tuning range is reduced. Operating at higher voltage increases power dissipation. Again, these alternatives are not particularly attractive.

What is needed, then, is a technique that achieves substantial phase noise improvement at minimal expense.

SUMMARY OF THE INVENTION

The present invention, generally speaking, allows for a substantial reduction in oscillator phase noise by modifying the transfer function of a portion of the oscillator, e.g., by adding a zero to the transfer function. Modifying the transfer function reduces the open-loop gain of the oscillator but achieves a desired phase compensation, allowing the oscillator to be operated at the resonance of the resonator instead of off resonance. In an exemplary embodiment, the transfer function is modified by choosing a capacitance value such that, instead of operating as a bypass at the frequency of interest, adds a zero to the transfer function of the oscillator and causes a change in frequency characteristics, achieving an increase in the effective Q of the oscillator. This increase in effective Q translates directly into reduced phase noise. Phase noise improvement in the range of 3dB has been demonstrated.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
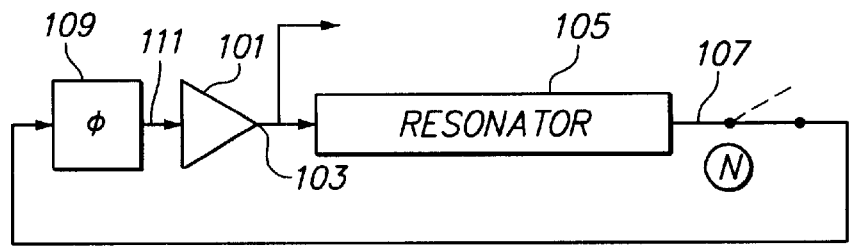
FIG. 1 is a diagram of a basic oscillator circuit.
Figure 2:
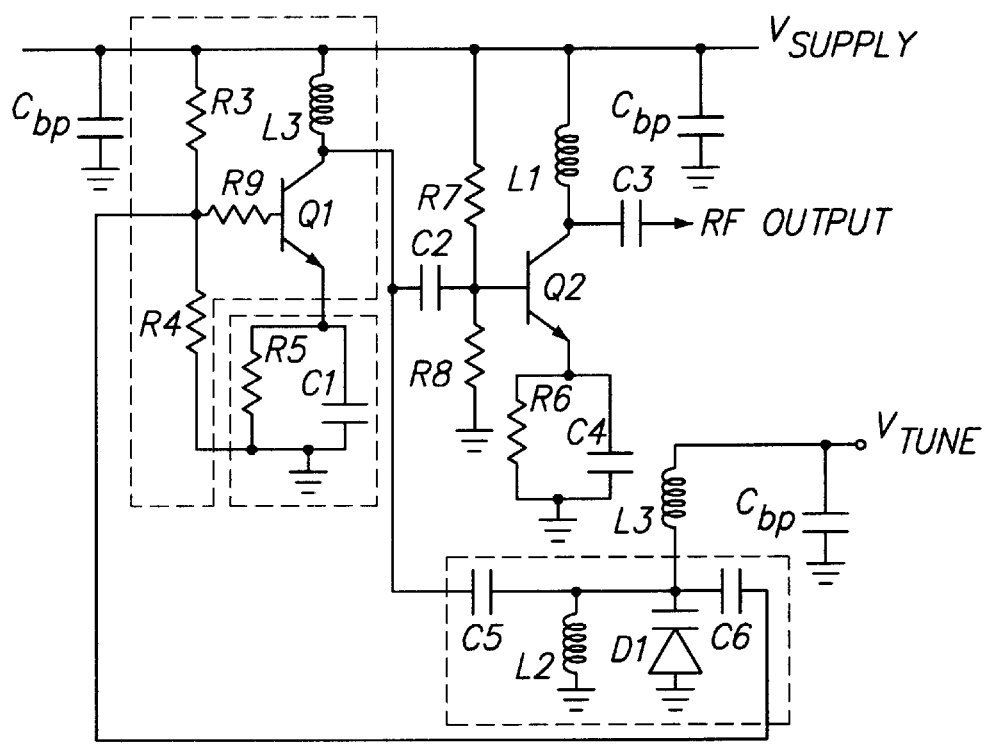
FIG. 2 is a diagram of an oscillator circuit of known topology.
Figure 3:
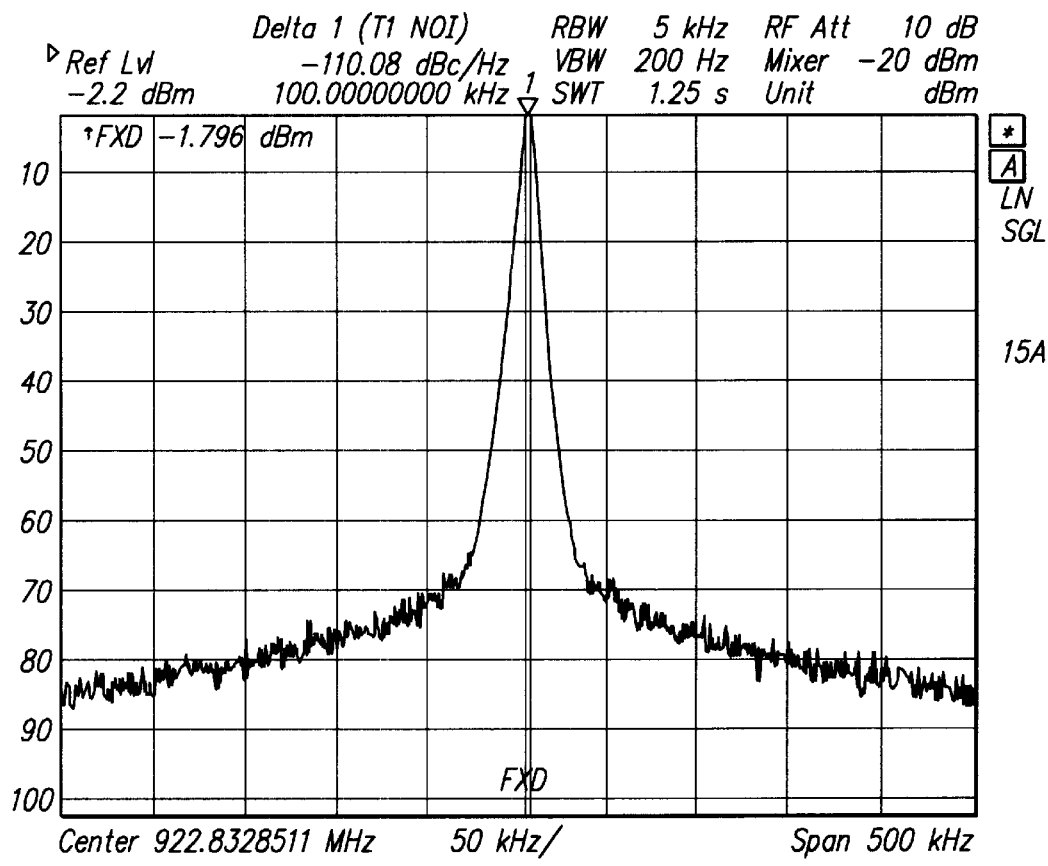
FIG. 3 is a plot showing phase noise of the known oscillator circuit.
Figure 4:
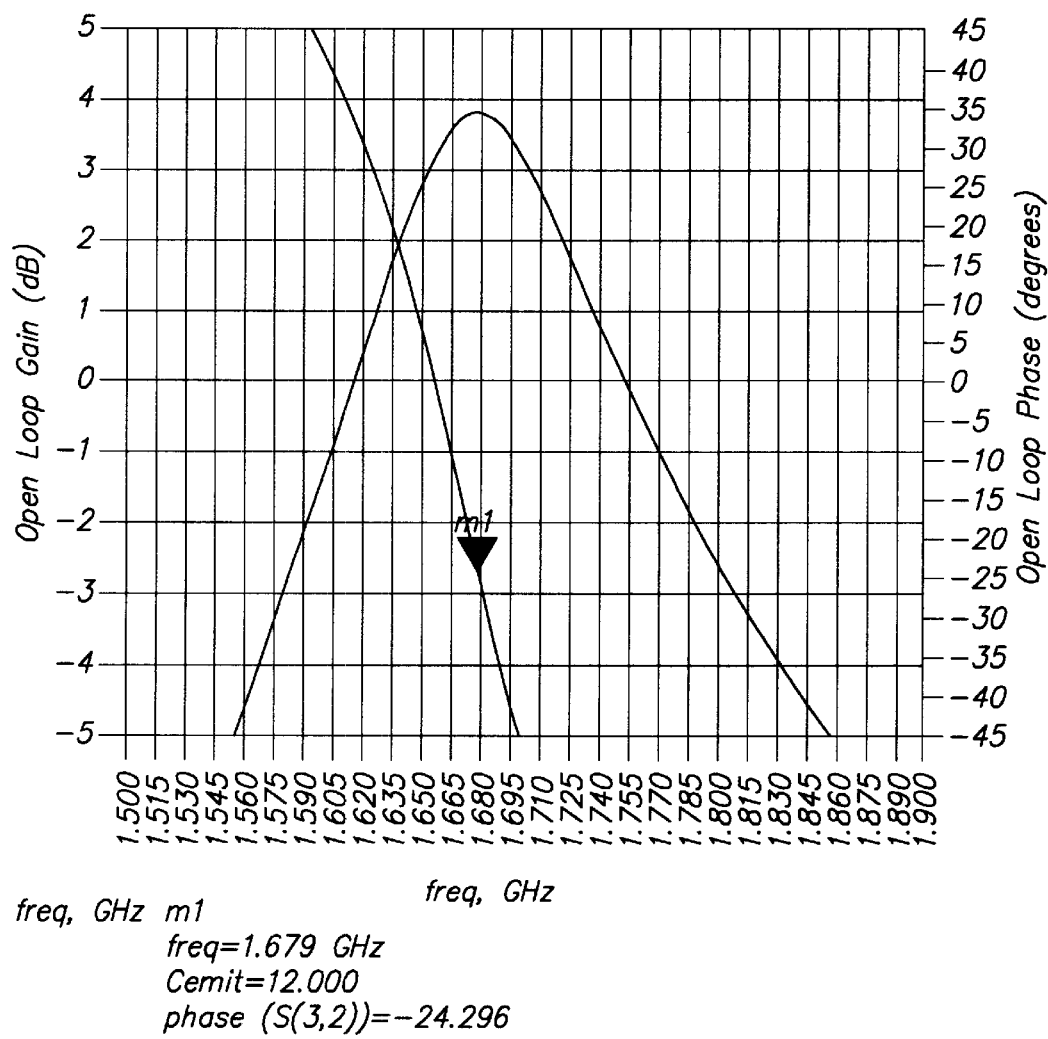
FIG. 4 is a plot of the open-loop gain and phase characteristics of a prior art oscillator circuit.

Using circuit simulation techniques, the oscillator circuit of FIG. 2 was modified by adjusting the value of the capacitor C1 to add a zero to the transfer function of the transistor portion of the oscillator circuit. As is well-known in the art, the effect of adding a zero is to provide phase lead, thereby affording an alternative mechanism for phase compensation. Component values in accordance with one embodiment of the modified oscillator circuit, including the empirically determined value for C1, are set forth hereinafter.

Figure 5:
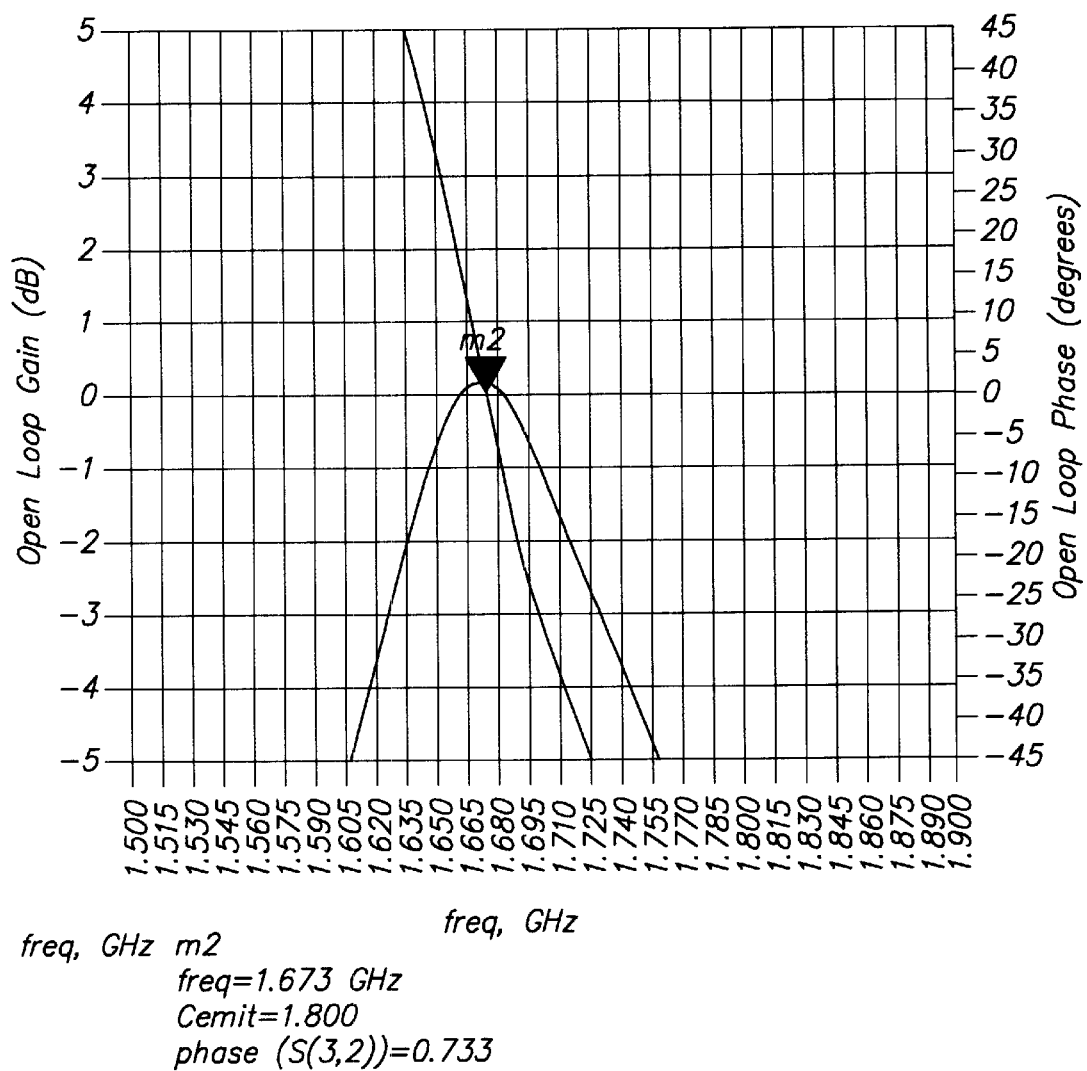
FIG. 5 is a plot of the open-loop gain and phase characteristics of a modified oscillator circuit.

FIG. 5 is a plot of the gain and phase characteristics of a modified oscillator circuit. As seen in FIG. 5, modification of the oscillator circuit results in a substantial decrease in gain, to just slightly greater than unity (OdB). Note, however, that the resonant frequency substantially coincides with a maximum-slope inflection point of the phase curve. Operation of the oscillator circuit about this point results in the circuit operating within the lowest-phase-noise region of the curve.

EXAMPLE

The oscillator circuit of FIG. 2 was built using the following component values:

TABLE 1

| Component | Value | Component | Value | Component | Value |
| --- | --- | --- | --- | --- | --- |
| R3 | 3.9K | L1 | 10 nh | C1 | 20 pf |
| R4 | 2.2K | L2 | 3.3 nh | C1' | 6.8 pf |
| R5 | 20 | L3 | 2.2 nh | C2 | 1.5 pf |
| R6 | 10 | | | C3 | 56 pf |
| R7 | 3.9K | | | C4 | 56 pf |
| R8 | 2.0K | | | C5 | 4.7 pf |
| R9 | 330 | | | C6 | 1.5 pf |
| | | | | $C_{bp}$ | 56 pf |

The oscillator circuit was then tested. Using a bypass capacitor (C1=20 pf), the oscillator circuit exhibited a resonant frequency of 922 MHz. Phase noise at 100 kHz offset measured=−110 dBc/Hz.

The capacitor C1 was then replaced by a capacitor having a value of 6.8 pf. The tuning voltage remained the same as in the previous test. The oscillator circuit exhibited a resonant frequency of 939 MHz. Phase noise at 100 kHz offset as measured to be −112.5 dBc/Hz, a 2.5 dB improvement.

With C1=6.8 pf, the tuning voltage was then adjusted to produce an identical frequency of 922 MHz as in the initial test. Phase noise at 100 kHz offset was measured to be −115.4 dBc/Hz, a 5.4 dB improvement. These results are summarized below:

TABLE 2

| C1(pf) | Phase Noise at 100 kHz dBc/Hz | Frequency MHz |
| --- | --- | --- |
| 20 | −110.0 | 922 |
| 6.8 | −112.5 | 939 |

TABLE 3

| C1(pf) | Phase Noise at 100 kHz dBc/Hz | Frequency MHz |
| --- | --- | --- |
| 20 | −110.0 | 922 |
| 6.8 | −115.4 | 922 |

Figure 6:
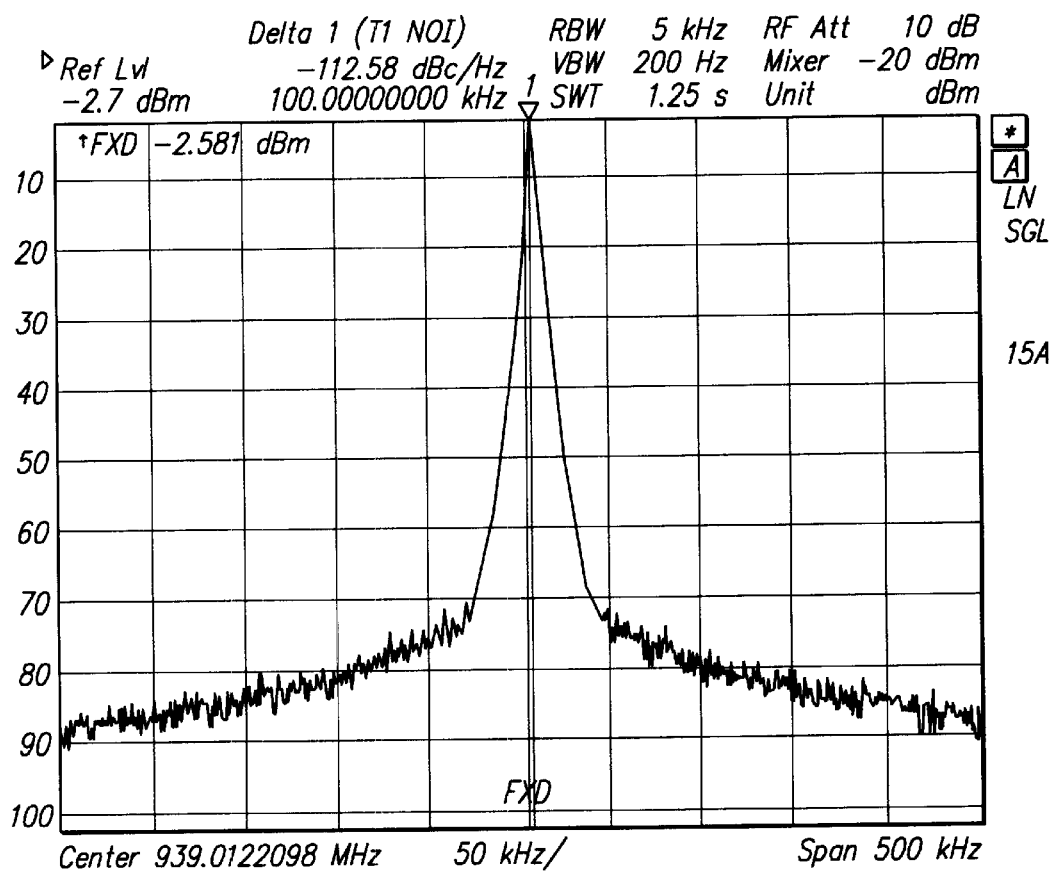
FIG. 6 is a plot showing phase noise of the modified oscillator circuit under one tuning condition.
Figure 7:
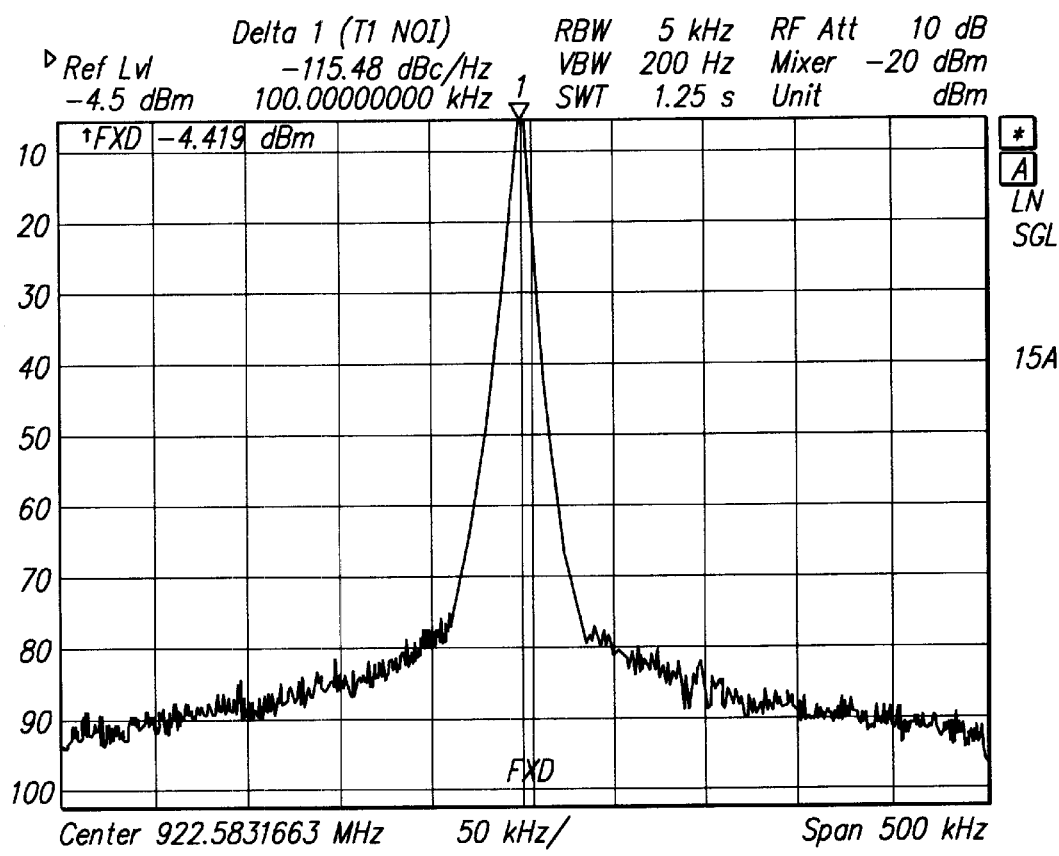
FIG. 7 is a plot showing phase noise of the modified oscillator circuit under another tuning condition.

The reduction in phase noise obtained in the foregoing example is illustrated in FIG. 6 and in FIG. 7, corresponding respectively to each of the foregoing tuning conditions. Based on the foregoing results, the improvement obtainable using the technique of the present invention is believed to be in range of 3–6 dB, a very significant improvement.

Thus there has been described an oscillator circuit having improved phase noise characteristics. The improvement in phase noise does not require a higher quality resonator circuit or any increase in component count or area but may be obtained simply through appropriate adjustment of component values.

It will be appreciated by those of ordinary skill in the art that the invention can be embodiment in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An oscillator circuit comprising:
a resonant circuit; and
a regenerative element coupled to the resonant circuit and having a feedback path including an impedance exhibiting substantial reactance at a frequency of interest;
wherein the impedance contributes to phase shift of the regenerative element, reducing gain of the regenerative element and increasing an effective Q factor of the resonator, whereby phase noise of the oscillator circuit is reduced.

2. The oscillator circuit of claim 1, wherein the regenerative element is a transistor.

3. The oscillator circuit of claim 2, wherein the transistor is an NPN transistor.

4. The oscillator circuit of claim 3, wherein the impedance comprises a parallel RC combination.

5. The oscillator circuit of claim 4, wherein the impedance is coupled between an emitter of the transistor and a reference potential.

6. The oscillator circuit of claim 1, further comprising a buffer stage coupled to the regenerative element and the resonant circuit, the buffer stage producing an output signal of the oscillator.

7. The oscillator circuit of claim 6, wherein the buffer stage comprises an NPN transistor.

8. The apparatus of claim 7, wherein the resonant circuit and the buffer stage are each capacitively coupled to the regenerative circuit.

* * * * *